US 11,153,550 B2

(12) United States Patent
Mitchell et al.

(10) Patent No.: US 11,153,550 B2
(45) Date of Patent: Oct. 19, 2021

(54) DEPTH CODEC FOR REAL-TIME, HIGH-QUALITY LIGHT FIELD RECONSTRUCTION

(71) Applicant: Disney Enterprises, Inc., Burbank, CA (US)

(72) Inventors: Kenneth J. Mitchell, Glendale, CA (US); Charalampos Koniaris, Glasgow (GB); Malgorzata E. Kosek, Edinburgh (GB); David A. Sinclair, Edinburgh (GB)

(73) Assignee: Disney Enterprises, Inc., Burbank, CA (US)

( * ) Notice: Subject to any disclaimer, the term of this patent is extended or adjusted under 35 U.S.C. 154(b) by 305 days.

(21) Appl. No.: 16/138,460

(22) Filed: Sep. 21, 2018

(65) Prior Publication Data

US 2019/0313080 A1    Oct. 10, 2019

Related U.S. Application Data

(60) Provisional application No. 62/653,960, filed on Apr. 6, 2018.

(51) Int. Cl.
*G06K 9/36* (2006.01)
*H04N 13/161* (2018.01)
(Continued)

(52) U.S. Cl.
CPC .............. *H04N 13/161* (2018.05); *G06T 9/40* (2013.01); *G06T 17/005* (2013.01);
(Continued)

(58) Field of Classification Search
CPC .... H04N 13/161; H04N 13/232; H04N 19/00; H04N 19/10; H04N 19/102;
(Continued)

(56) References Cited

U.S. PATENT DOCUMENTS 7,385,611 B1 *   6/2008  Toksvig ............. G06K 9/00275
                                                      345/582
8,073,275 B2 *  12/2011  Shatz .................. H04N 1/00244
                                                      382/239
(Continued)

OTHER PUBLICATIONS

Babis Koniaris, Maggie Kosek, David Sinclair and Kenny Mitchell, "Real-time Rendering with Compressed Animated Light Fields", Proceedings of the 43rd Graphics Interface Conference (GI '17), Jan. 2017, pp. 33-40 (Year: 2017).*

(Continued)

*Primary Examiner* — Eric Rush
(74) *Attorney, Agent, or Firm* — Patterson + Sheridan, LLP

(57) ABSTRACT

Systems, methods, and articles of manufacture are disclosed that enable the compression of depth data and real-time reconstruction of high-quality light fields. In one aspect, spatial compression and decompression of depth images is divided into the following stages: generating a quadtree data structure for each depth image captured by a light field probe and difference mask associated with the depth image, with each node of the quadtree approximating a corresponding portion of the depth image data using an approximating function; generating, from the quadtree for each depth image, a runtime packed form that is more lightweight and has a desired maximum error; and assembling multiple such runtime packed forms into per-probe stream(s); and decoding at runtime the assembled per-probe stream(s). Further, a block compression format is disclosed for approximating depth data by augmenting the block compression format 3DC+(BC4) with a line and two pairs of endpoints.

20 Claims, 8 Drawing Sheets

(51) Int. Cl.
  *H03M 13/00* (2006.01)
  *H04N 19/96* (2014.01)
  *G06T 17/00* (2006.01)
  *H04N 19/11* (2014.01)
  *H04N 19/12* (2014.01)
  *G06T 9/40* (2006.01)
  *H04N 19/103* (2014.01)
  *H04N 19/169* (2014.01)
  *H04N 19/19* (2014.01)
  *H04N 19/597* (2014.01)

(52) U.S. Cl.
  CPC ... *H03M 13/6513* (2013.01); *H03M 13/6572* (2013.01); *H04N 19/103* (2014.11); *H04N 19/11* (2014.11); *H04N 19/12* (2014.11); *H04N 19/1883* (2014.11); *H04N 19/19* (2014.11); *H04N 19/597* (2014.11); *H04N 19/96* (2014.11)

(58) Field of Classification Search
  CPC .. H04N 19/103; H04N 19/105; H04N 19/109; H04N 19/11; H04N 19/119; H04N 19/12; H04N 19/13; H04N 19/132; H04N 19/134; H04N 19/136; H04N 19/137; H04N 19/139; H04N 19/146; H04N 19/147; H04N 19/154; H04N 19/157; H04N 19/159; H04N 19/169; H04N 19/174; H04N 19/176; H04N 19/177; H04N 19/1883; H04N 19/30; H04N 19/36; H04N 19/40; H04N 19/423; H04N 19/436; H04N 19/44; H04N 19/46; H04N 19/597; H04N 19/70; H04N 19/96; G06T 9/00; G06T 9/001; G06T 9/004; G06T 9/40; G06T 15/00; G06T 15/005; G06T 15/06; G06T 15/08; G06T 15/40; G06T 17/005; H03M 7/00; H03M 7/30; H03M 7/3059; H03M 7/3062; H03M 7/3064; H03M 7/3066; H03M 13/00; H03M 13/03; H03M 13/29; H03M 13/6513; H03M 13/6561; H03M 13/6572

USPC ........ 382/154, 232–234, 236, 239–241, 302, 382/304; 375/240.01, 240.02, 240.08, 375/240.09, 240.12, 240.13, 240.24; 345/419–424, 505; 348/384.1, 390.1, 348/397.1, 400.1, 404.1, 415.1, 420.1; 709/247

See application file for complete search history.

(56) References Cited

U.S. PATENT DOCUMENTS

| | | | |
|---|---|---|---|
| 8,390,622 B2* | 3/2013 | Park | G06T 15/205 345/427 |
| 9,451,291 B1* | 9/2016 | Bozinovic | H04N 19/436 |
| 10,063,883 B2* | 8/2018 | Zheng | H04N 19/597 |
| 2015/0245061 A1* | 8/2015 | Chen | H04N 19/597 375/240.13 |
| 2016/0381387 A1* | 12/2016 | Domanski | H04N 19/593 375/240.08 |
| 2018/0268570 A1* | 9/2018 | Budagavi | G06T 9/001 |

OTHER PUBLICATIONS

Yannick Morvan, Peter H. N. de With, and Dirk Farin, "Platelet-based coding of depth maps for the transmission of multiview images", Proc. SPIE 6055, Stereoscopic Displays and Virtual Reality Systems XIII, 60550K, Jan. 2006, pp. 1-12 (Year: 2006).*

Vahid Kiani, Ahad Harati, and Abedin Vahedian, "Planelets-A Piecewise Linear Fractional Model for Preserving Scene Geometry in Intra-Coding of Indoor Depth Images", IEEE, IEEE Transactions on Image Processing, vol. 26, No. 2, Feb. 2017, pp. 590-602 (Year: 2017).*

P. Merkle, Y. Morvan, A. Smolic, D. Farin, K. Muller, P.H.N. de With, and T. Wiegand, "The effects of multiview depth video compression on multiview rendering", Elsevier, Signal Processing: Image Communications 24, 2009, pp. 73-88 (Year: 2009).*

Piotr Didyk et al. 2010. Adaptive Image-space Stereo View Synthesis. In VMV. 299-306.

Andrew D. Wilson. 2017. Fast Lossless Depth Image Compression. In Proceedings of the 2017 ACM International Conference on Interactive Surfaces and Spaces (ISS '17). ACM, New York, NY, USA, 100-105. <https://doi.org/10.1145/3132272.3134144>.

* cited by examiner

DEPTH CODEC FOR REAL-TIME, HIGH-QUALITY LIGHT FIELD RECONSTRUCTION

CROSS-REFERENCE TO RELATED APPLICATIONS

This application claims benefit of U.S. provisional patent application Ser. No. 62/653,960, filed Apr. 6, 2018, which is herein incorporated by reference in its entirety.

BACKGROUND

Field of the Disclosure

Aspects of the disclosure presented herein relate to image rendering and, more specifically, to a depth codec for real-time, high-quality light field reconstruction.

Description of the Related Art

Recent advances in virtual and augmented reality software and hardware have sparked interest in high-quality mixed reality experiences that seamlessly blend together characters and environments. For immersive and interactive experiences that allow free user movement with six degrees of freedom, video content that is presented needs to be adapted for consumption from any point of view.

Video codec development has been strongly focused on color data, rather than depth data. However, depth estimation from color in real-time can be prohibitively expensive, and traditional video codecs have demonstrated poor performance when the amount of data to be decoded becomes large.

SUMMARY

One aspect of this disclosure provides a computer-implemented method that generally includes determining a mask for a received depth image frame based, at least in part, on differences between the received depth image frame and one or more previous depth image frames. The method further includes generating a quadtree data structure that includes nodes associated with pixels of the depth image frame masked by the determined mask. Each node of the generated quadtree indicates one of a plurality of functions used to approximate a corresponding portion of the received depth image frame and coefficient values used in the approximation.

Another aspect of this disclosure provides a computer-implemented method for compressing a pixel tile in a depth image. The method generally includes sampling a parameter space of values for a line, two pairs of endpoints on respective sides of the line, and a respective palette index for each pixel of the pixel tile. The method further includes determining, based on the sampling, values for the line, the two pairs of endpoints, and the respective palette index for each pixel that minimize an error, where the respective palette index that is determined for each pixel is associated with one of the two pairs of endpoints that are determined. In addition, the method includes storing the determined values for the line, the two pairs of endpoints, and the respective palette index for each pixel.

Other aspects include, without limitation, computer-readable media that include instructions that enable one or more processing units to implement one or more aspects of the disclosed methods, as well as systems configured to implement one or more aspects of the disclosed methods.

BRIEF DESCRIPTION OF THE DRAWINGS

So that the manner in which the above recited aspects are attained and can be understood in detail, a more particular description of aspects of this disclosure, briefly summarized above, may be had by reference to the appended drawings.

It is to be noted, however, that the appended drawings illustrate only typical aspects of this disclosure and are therefore not to be considered limiting of its scope, for the aspects disclosed herein may admit to other equally effective configurations.

DETAILED DESCRIPTION

Figure 1:
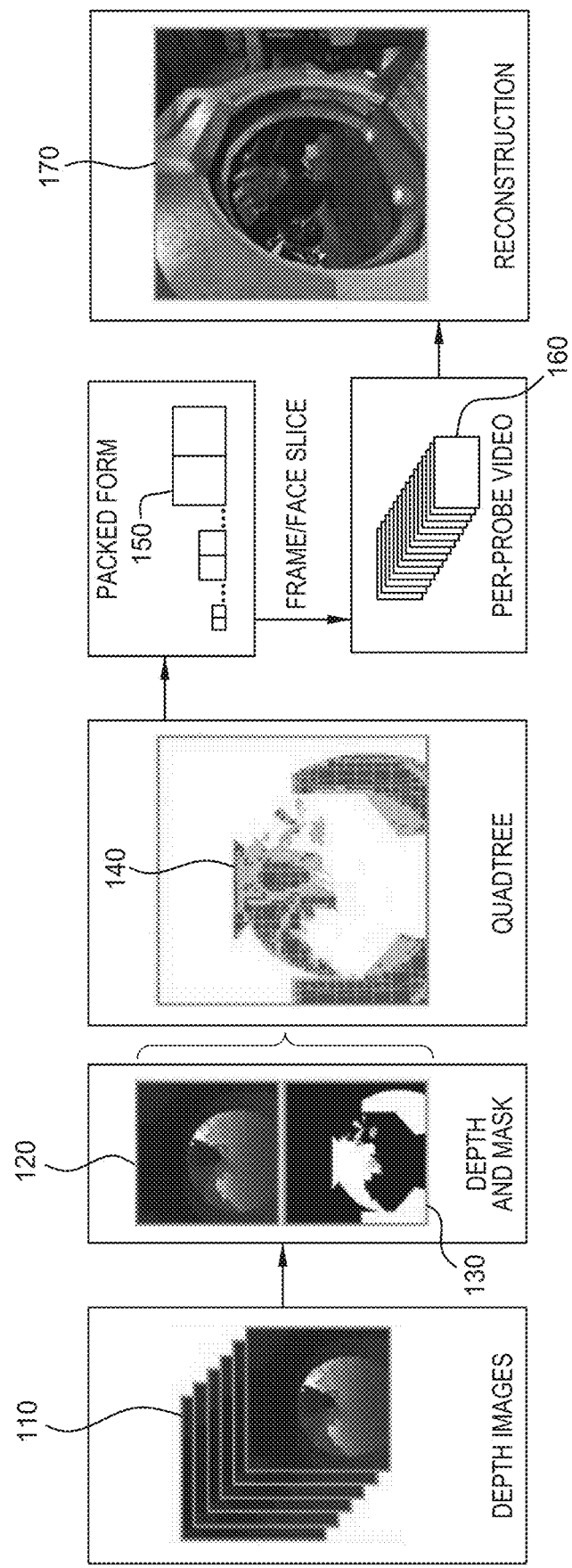
FIG. 1 illustrates a depth codec pipeline for compressing depth images of high bit-depth and decompressing the compressed data in real-time, according to an aspect of this disclosure.

Aspects presented herein provide techniques permitting depth data compression and real-time, high-quality light field reconstruction. In one aspect, spatial compression and decompression of depth images of high bit-depth is divided into the following stages: generating a quadtree data structure for each depth image captured by a light field probe and difference mask associated with the depth image, with each node of the quadtree approximating a corresponding portion of the depth image data using an approximating function; generating, from the quadtree for each depth image, a runtime packed form that is more lightweight and has a desired maximum error; and assembling multiple such runtime packed forms into per-probe stream(s) that are organized by, e.g., frame, cubemap face, and cell; and decoding at runtime the assembled per-probe stream(s). Further, a block compression format, referred to herein as BC4-Wedged (BC4w), is disclosed that exploits the typical characteristics of depth streams by augmenting the block compression format 3DC+(also known as BC4) with a line and 2 pairs of endpoints, each of which is chosen based on the halfspace with respect to the line. The BC4w modeling function may be used in nodes of the quadtree, described above, to approximate underlying data, and in particular the BC4w modeling function allows for depth variation while approximating tiles with depth discontinuities.

In the following, reference is made to aspects of the present disclosure. However, it should be understood that this disclosure is not limited to specific described aspects. Instead, any combination of the following features and elements, whether related to different aspects or not, is contemplated to implement and practice the aspects disclosed herein. Furthermore, although aspects may achieve advantages over other possible solutions and/or over the prior art, whether or not a particular advantage is achieved by a given aspect is not limiting of this disclosure. Thus, the following aspects, features, configurations and advantages are merely illustrative and are not considered elements or limitations of the appended claims except where explicitly recited in a claim(s). Likewise, reference to "the aspect" shall not be construed as a generalization of any inventive subject matter disclosed herein and shall not be considered to be an element or limitation of the appended claims except where explicitly recited in a claim(s).

As will be appreciated by one skilled in the art, aspects of the present disclosure may be embodied as a system, method or computer program product. Accordingly, aspects of the present disclosure may take the form of an entirely hardware configuration, an entirely software configuration (including firmware, resident software, micro-code, etc.) or a configuration combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to aspects of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Aspects of the present disclosure may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present disclosure, a user may access applications (e.g., a compression application and/or a decompression application) or related data available in the cloud. For example, the compression application could execute on a computing system in the cloud and perform compression of depth images according to techniques disclosed herein and store the compressed data at a storage location in the cloud, and the decompression application could execute on a computing system in the cloud and perform decompression of the compressed data that is stored. Doing so allows a user to access this information from any computing system attached to a network connected to the cloud (e.g., the Internet).

Referring now to FIG. 1, a depth codec pipeline is illustrated for compressing depth images of high bit-depth and decompressing the compressed data in real-time, according to an aspect of this disclosure. As shown, a compression application (e.g., the compression application 722 shown in FIG. 7) receives depth images 110 and, for each depth image i 120, the compression application determines a difference mask 130 of the pixels that need to be compressed from depth frames [i–N,i]. The depth images 110 and associated difference mask may be obtained in any technically feasible manner. In one configuration, the depth images 110 may be captured by a light field probe in the scene that stores color data in a single point in space, representing a single point in the 5D plenoptic function, with the depth data indicating distances to the closest surface in any direction. For example, the depth images 110 may be rendered using virtual cameras, such as 360° cubemap cameras, that are placed in a scene according to camera placement techniques disclosed in U.S. patent application Ser. No. 15/971,950, entitled "REAL-TIME RENDERING WITH COMPRESSED ANIMATED LIGHT FIELDS" and filed May 4, 2018, which is incorporated herein by reference in its entirety. In such a case, the depth images 110 may be associated with six video streams per probe camera view, one per cubemap face.

The depth codec according to one configuration includes both temporal and spatial components, with the temporal component including determination of the difference mask 130 and the spatial component targeting only the subset of pixels indicated by the difference mask 130. The difference mask 130 is determined for each depth image 120 as part of temporal compression, in which either the entirety of a depth image frame is kept as a keyframe or the depth image frame is compressed to small rectangular areas that include changes between that frame and previous frame(s) and that are indicated by the difference mask 130. In one configuration, the difference mask 130 may indicate pixels that needed to be updated for the current depth image 120, and the compression application may determine the difference mask 130 by calculating differences to the previous N frames, with N being, e.g., a user-specified value. This is akin to the temporal depth compression procedure disclosed in U.S. patent application Ser. No. 15/971,950, entitled "REAL-TIME RENDERING WITH COMPRESSED ANIMATED LIGHT FIELDS," in which each depth frame is stored as either a keyframe including all data for the frame or a P-frame which only encodes differences to a last keyframe, thereby exploiting the fact that depth maps captured by a static camera typically display low frequency of updates. Similarly, the difference mask 130 encodes differences to the previous N frames using, e.g., a set of axis-aligned bounding boxes (AABBs) and by storing a list of AABB coordinates and the raw depth data included in each such coordinate. In such a case, the least number of pixels may be updated by calculating as-tight-as-possible AABBs. Further, the compression application may determine keyframes that include all data for some depth image frames based on interpolation error that accumulates over time, with a new keyframe being added when the interpolation error exceeds a given threshold. For example, on a quadtree patch basis, keyframes may be temporally determined based on the type of interpolation being applied, in which case the patch may be valid for a certain number of keyframes under linear interpolation but for more keyframes under quadratic interpolation, etc.

Subsequent to the temporal depth compression that includes the determination of the difference masks (e.g., the difference mask 130), the first step of the spatial depth compression is quadtree generation, where the compression application generates a quadtree for each depth image (e.g., the depth image 120) and associated difference mask (e.g., the mask 130 or the entire depth image in the case of keyframes). Then, the compression application generates a runtime packed form 150 given a desired maximum error for the final compressed stream, as discussed in greater detail below. In the quadtree generation, the input is the depth image 120, the mask 130 of pixels that need to be compressed, and a maximum reconstruction error $E_{max}$ (which may be a user-specified value), and the output of the quadtree generation is a partial quadtree 140 with nodes covering all masked pixels. The maximum reconstruction error is used to bound the optimization time required. It should be understood that coarser quadtree 140 nodes can take significantly more time to approximate due to the larger search space, which is also subject to the modeling function used.

In one configuration, the compression application determines, based on approximation errors, the best approximating functions and associated coefficient values used in the approximation, which are stored in the quadtree's 140 nodes, with the quadtree 140 being calculated bottom-to-top as discussed in greater detail below and each node approximating the underlying data using one of the following four approximating functions that is the best approximating function: raw, platelet, biquadratic, and BC4w. That is, the compression application adaptively selects among a number of approximating functions based on scene content by modeling the error for each of the approximating functions. For example, biquadratic function approximations may work better for smoothed curved surfaces, while platelets may be better for general uneven surfaces. Other approximating functions (e.g., a bicubic modeling function) may be used in addition to or in lieu of raw, platelet, biquadratic, and BC4w functions in alternative configurations. In addition, some modeling functions may only be allowed to be used at certain quadtree 140 levels, with this "modeling function type" property being used as an implicit parameter of the compressed stream.

High depth errors can prove catastrophic for reconstruction quality, producing animated floating geometry or holes, leading to further errors in color reconstruction and user perception of the environment. To prevent high depth errors, the compression application uses two criteria for choosing a best approximating function for a node in one configuration. In such a case, the first criterion is the maximum absolute distance in log-space per block of dimension k:

$$e_{max} = \max_{x,y \in [1,k]} \|d_{xy} - \hat{d}_{xy}\|. \quad (1)$$

For each block, the compression application may determine the error of equation (1) for all modeling functions and keep the ones with acceptable error $e_{max} \leq E_{max}$. For such acceptable modeling functions, the compression application further determines their mean-squared error (MSE) for the block $$e_{MSE} = \frac{1}{k^2} \sum_{y=1}^{k} \sum_{x=1}^{k} (d_{xy} - \hat{d}_{xy})^2 \qquad (2)$$

and selects the modeling function that approximates the block with the lowest MSE, also referred to herein as the best approximating function.

Figure 2:
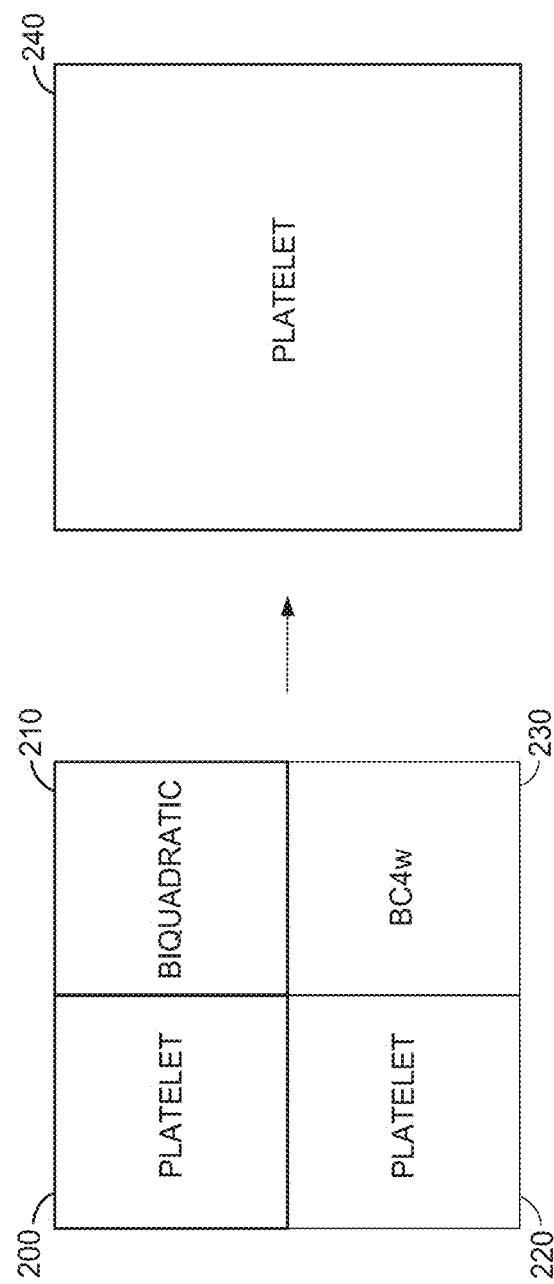
FIG. 2 illustrates an example coalescing of nodes in a bottom-to-top approach to calculating a quadtree, according to an aspect of this disclosure.

As described, the compression application calculates the quadtree 140 from bottom to top in one configuration, with a node being approximated only if all of its existing children in the mask 130 can be approximated by any modeling function within the given error $E_{max}$. FIG. 2 illustrates an example coalescing of nodes in the bottom-to-top approach to calculating the quadtree 140, according to an aspect of this disclosure. In such coalescing, the four child nodes of a given node are represented as a combined block within the same error $E_{max}$ using one modeling function. As shown, the compression application determines that the best approximating functions for each of the densest (i.e., highest resolution) quadtree nodes 200, 210, 220, and 230 are the platelet modeling function for the node 200, the biquadratic modeling function for the node 210, the platelet modeling function for the node 220, and the BC4w modeling function for the node 230. The compression application then proceeds one level up the quadtree 140 to a less dense quadtree node 240 and determines if the child nodes 200, 210, 220, and 230 of the node 240 can all be approximated by the same modeling function within the same error $E_{max}$. Illustratively, the platelet modeling function can be used to approximate all of the child nodes 200, 210, 220, and 230 within the error $E_{max}$ and with least error relative to the other approximating functions, so the compression application uses the platelet modeling function to approximate the node 240, i.e., the node 240 stores the platelet modeling function and associated coefficient values used in the approximation. In addition, the approximations of the denser nodes 200, 210, 220, and 230 need not be thrown away, and in one configuration, the approximations of the denser nodes 200, 210, 220, and 230 are stored as part of the quadtree 140 so that when the packed form 150, discussed in greater detail below, is generated from the quadtree 140, either data from the node 240 or the denser nodes 200, 210, 220, and 230 (and other nodes or their parent/ancestors or children/descendants) is chosen to be included in the packed form 150 based on a given maximum reconstruction error.

In one configuration, raw, platelet, biquadratic, and BC4w modeling functions are used. These modeling functions have coefficients whose values can be stored within 32 bytes, allowing efficient decoding by means of random access. The finest level of the quadtree 140 may include 4×4 pixel nodes (or any other sized pixel nodes, such as 8×8, 16×16, 32×32, etc.) storing uncompressed quantized data, fully occupying all 32 bytes, in one configuration. The raw modeling function, which stores the raw pixel data directly as 16 16-bit values in a quantized logarithmic z space, is used only in this finest level (4×4 pixel tiles) and exists as a fail-safe when no good approximation can be found given an error threshold in coarser level nodes $$z_{xy} = D_{xy}, \qquad (3)$$

where D is the quantized depth data and $x, y \in [1, 4]$.

The platelet modeling function approximates the floating point linear depth data of a node at any level using two planar surfaces separated by a line:

$$z = \begin{cases} a_0 x + a_1 y + a_2 & \text{when } (i, j) \text{ left of line} \\ b_0 x + b_1 y + b_2 & \text{otherwise} \end{cases}, \qquad (4)$$

where $x, y \in [1, 2^{3+k}]$.

The biquadratic modeling function approximates the floating point linear depth data of a node at any level using a biquadratic surface:

$$z_{xy} = a_0 x + a_1 y + a_2 xy + a_3 x^2 + a_4 y^2 + a_5. \qquad (5)$$

Platelets and biquadratic functions may be calculated by solving linear systems. For biquadratics in particular, the compression application may calculate the design matrix A and output vector b as follows:

$$X = [0, 1, 0, 1, 2, 0]$$

$$Y = [0, 0, 1, 1, 0, 2]$$

$$A_{ij} = \sum_{y=1}^{k} \sum_{x=1}^{k} x^{X_i + X_j} y^{Y_i + Y_j} \qquad (6)$$

$$b_i = \sum_{y=1}^{k} \sum_{x=1}^{k} xy d_{xy}, \qquad (7)$$

where k is the block dimension and $d_{xy}$ is the depth value at a pixel (x, y).

Platelets and biquadratic functions capture structured surfaces (planar and smooth) well, but can fail to capture depth variations on such surfaces. When a high quality approximation is required and these functions fail, the raw modeling function may need to be used at the finest level of the quadtree, but such use of the raw modeling function is considerably more expensive (4×). To improve high quality approximations, the compression application in one configuration uses a modeling function referred to herein as BC4w. The BC4w modeling function, which is adapted for 16 bits per pixel and 8×8 pixel tiles in one configuration, utilizes a line and 2 pairs of endpoints, each of the pairs being chosen based on the halfspace with respect to the line. In such a case, each 8×8 pixel tile is approximated using 32 bytes, offering a 4:1 compression ratio, with each compressed data block including 4 depth endpoints (the 2 endpoint pairs), palette indices per pixel in the 8×8 pixel tile, and the line.

Figure 3A:
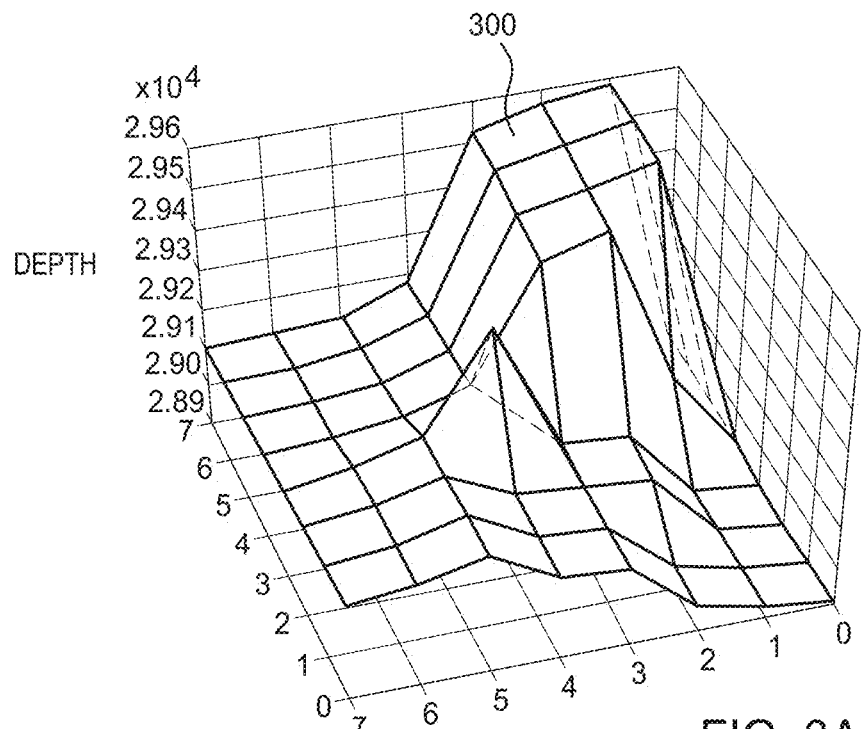
FIGS. 3A-3B illustrate an example line and two example endpoint pairs determined by the BC4-Wedged (BC4w) modeling function, according to an aspect of this disclosure.
Figure 3B:
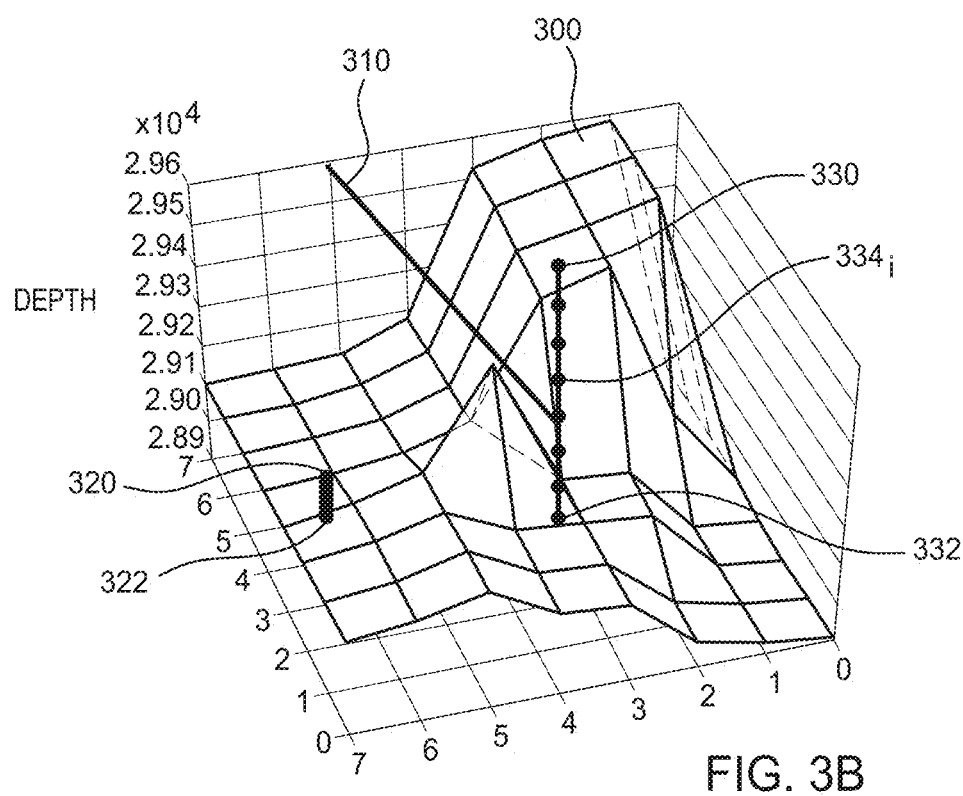

FIGS. 3A-3B illustrates an example line 310 and two example endpoint pairs 320-322 and 330-332 determined by the BC4w modeling function for a depth pixel tile 300, according to an aspect of this disclosure. FIG. 3A shows the reference 8×8 depth pixel tile 300, also referred to herein as a "block." FIG. 3B shows the line 310 and two endpoint pairs 320-322 and 330-332 that the BC4w modeling function uses to approximate the depth pixel tile 300. As shown, the line 310 separates pixels of the pixel tile 300 into two conceptual regions, and the two pairs of endpoints 320-222 and 330-332 representing depth values used to approximate in-between depths for each of the regions, and palette indices (e.g., palette indices 334; associated with the endpoints 330-332) that include evenly spaced depth values between the endpoints 320-322 and 330-332 as well as the endpoints 320-322 and 330-332 themselves. The intuition behind the BC4w modeling function is it attempts to approximate two different surfaces that are on a pixel tile. For example, if the pixel tile depicted the edge of a screen, then the BC4w modeling function may approximate part of the pixel tile as the screen and the rest of the pixel tile as background, with the line being the depth edge that separates the two surfaces and the two endpoint pairs representing the two depth planes. In such a case, rather than storing a single value for the screen or the background, a range of depth values (that is quantized using palette indices) is stored.

As shown, pixels in the pixel tile 300 that are on the left of the line 310 are assigned one of eight palette index values that are equidistant and include the endpoints 320-322, thereby quantizing pixel depth values as the eight palette index values rather than representing the pixel depth values as, e.g., floating point numbers. Similarly, pixels in the pixel tile 300 that are on the right of the line 310 are assigned one of eight palette index values that are equidistant, and include, the endpoints 330-332. Illustratively, the pair of endpoints 330-332 are further apart than the pair of endpoints 320-322, as the variation of depth values on the left of the line 310 is greater than on the right of the line 310. As a result, the palette indices $334_i$ between with the endpoints 330-332 are also further apart than the palette indices between the pair of endpoints 320-322, making the compression accuracy higher on the left of the line 310 than on the right of the line 310.

Figure 4A:
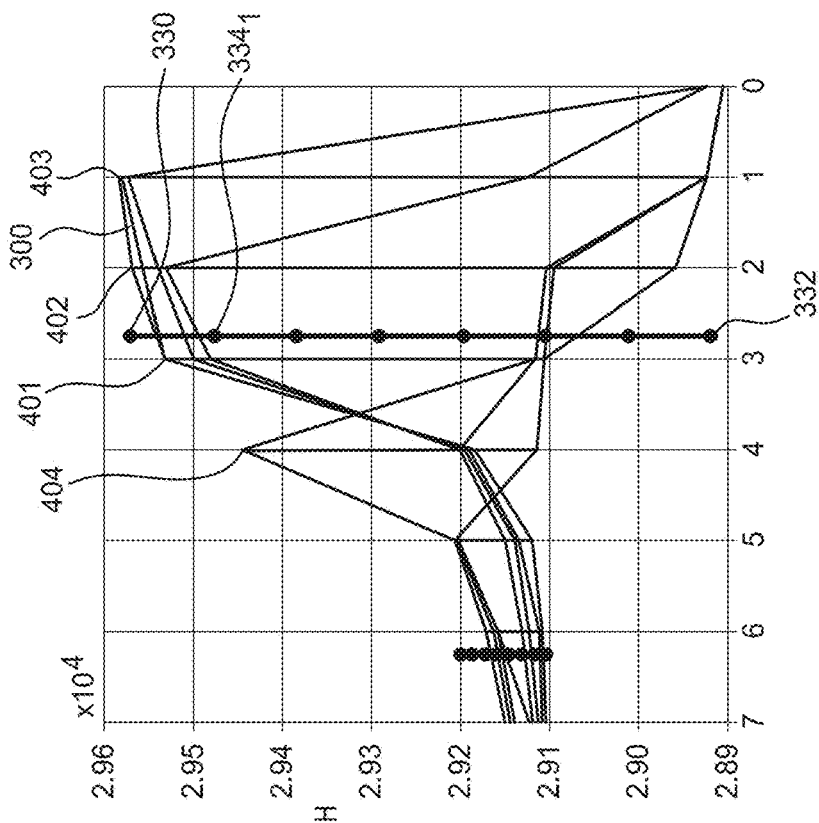
FIGS. 4A-4B illustrate an example of the BC4w modeling function snapping depth values to the nearest palette indices associated with a selected endpoint pair, according to an aspect of this disclosure.
Figure 4A:
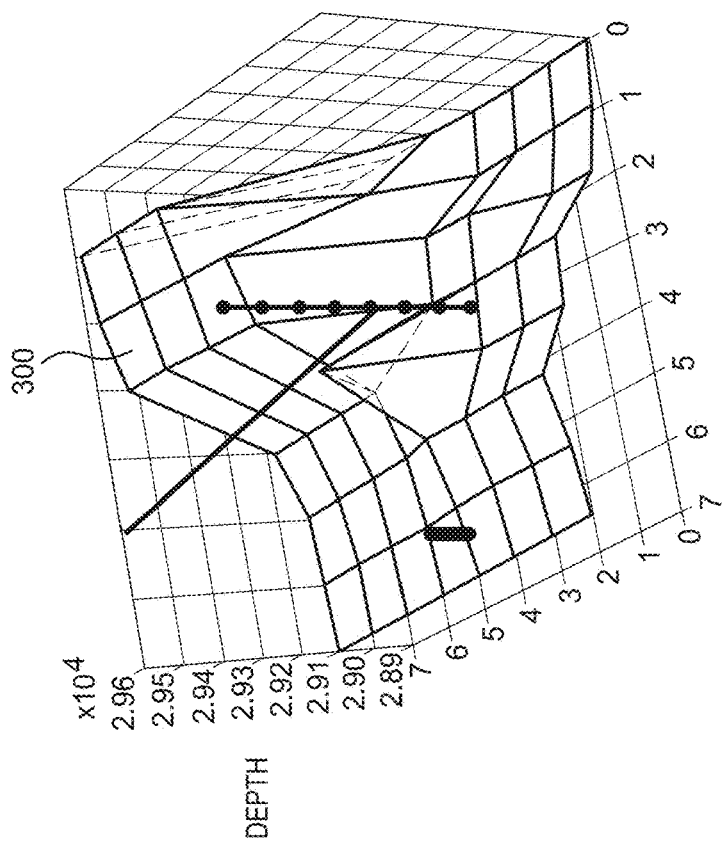
Figure 4B:
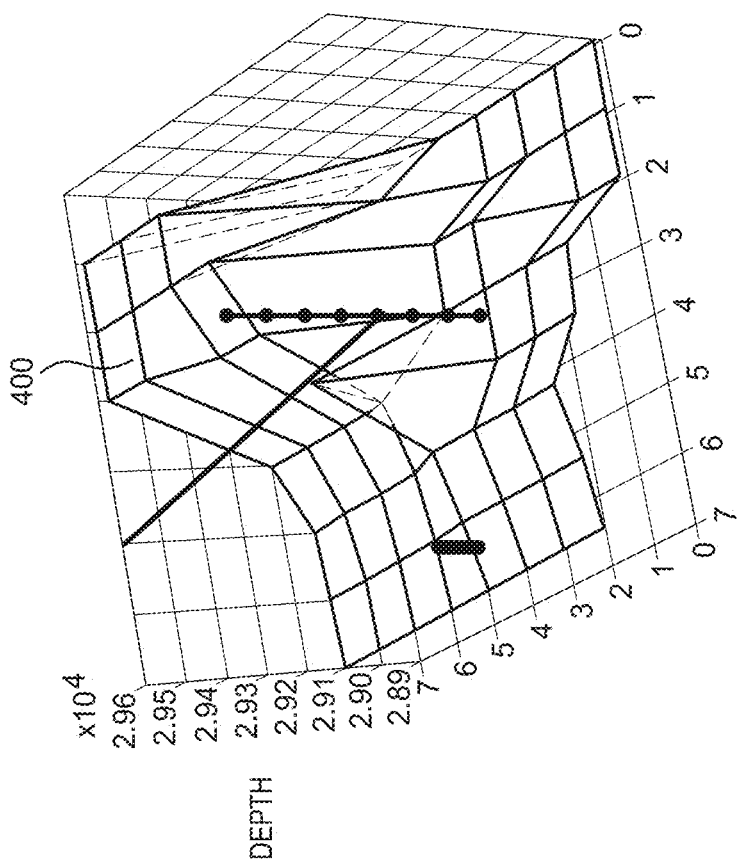
Figure 4B:
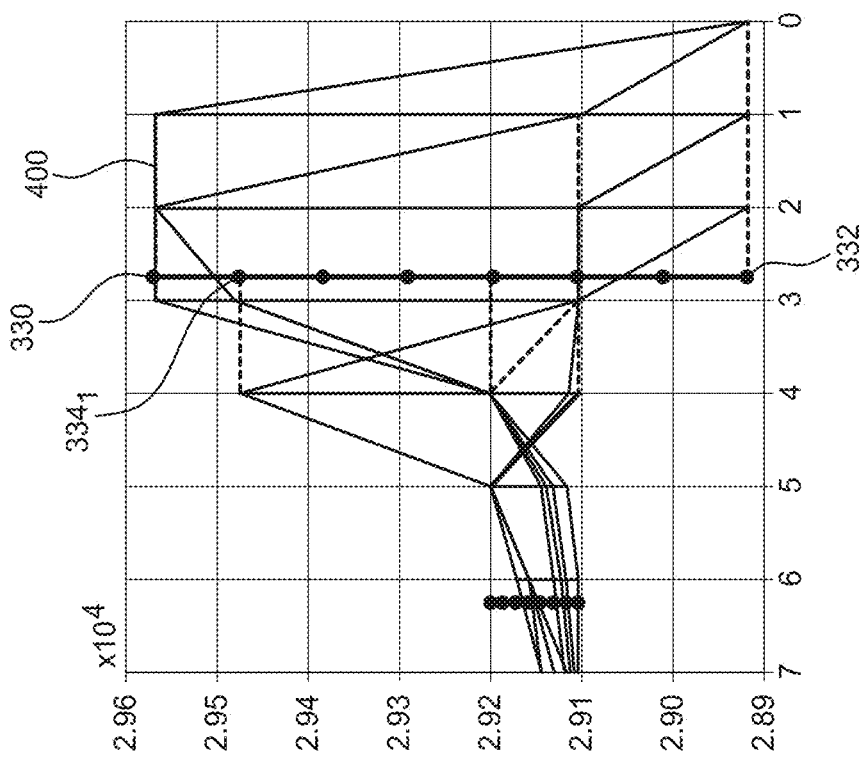

Unlike the block compression format 3Dc+(also known as BC4), the BC4w modeling function uses 2 endpoint pairs instead of a single pair, and a pixel in the pixel tile selects one of the 2 endpoint pairs that corresponds with the side of the line that the pixel is on. For example, each of the 64 pixels in the 8×8 depth pixel 300 selects one of the endpoint pairs 320-322 and 330-332 based on which side of the line 310 the pixel is on. Then, depth values of the pixels are snapped to the nearest palette indices associated with the selected endpoint pair and used to interpolate between the endpoint values, as discussed in greater detail below. FIGS. 4A-4B illustrate an example of the BC4w modeling function snapping depth values to the nearest palette indices associated with a selected endpoint pair, according to an aspect of this disclosure. As shown in FIG. 4A, the depth values 401-403 are closest to the palette index 330 associated with the selected endpoint pair 330-332, while the depth value 404 is closest to the palette index $334_1$. As shown in FIG. 4B, the depth values 401-403 have been snapped to the palette index 330 and the depth value 404 has been snapped to the palette index $334_1$. As it is known which side of the line 310 each pixel is on, the only information that needs to be stored for each pixel is the associated palette index for that pixel. In one configuration, the endpoints may use the following numerical order to break degeneracy: if $d_0>d_1$, the palette indices correspond to the 8 evenly spaced values between (and including) the endpoints, where if $d_0<d_1$, the palette indices correspond to the 6 evenly spaced values between (and including) the endpoints and additionally include the boundary values of the 16-bit space: 0 and 65535. That is, the depth endpoint order is used to determine the interpolation parameters. For example, for a function $f(x)$ where x is between 0 and 7, the depth endpoint order (whether $d_0>d_1$ or $d_0<d_1$) may determine if $f(x)$ will just interpolate between 2 endpoints—$f(x)=d_0+(d_1-d_0)x/7$—or if special meaning is assigned to x==5 and x==6 such that $f(5)=0$, $f(6)=65535$, and otherwise $f(x)=d_0+(d_1-d_0)x/4$.

In one configuration, the BC4w modeling function may be implemented in a graphics processing unit (GPU) and sample the parameter space as densely as possible in order to determine optimal values for the line, the 2 depth ranges represented by the endpoint pairs, and a respective palette index for each pixel in the pixel tile. In such a case, for each side of each potential line with discrete endpoints that are part of the 8×8 pixel block, the BC4w modeling function searches for the depth endpoints that minimize reconstruction error of the pixels on that side of that line. That is, the compression application may try as many valid combinations of such values as possible (e.g., try all of the potential lines and, for each line, determine the optimal depth range for each side of the line), use the values that are tried to perform reconstructions and check the errors of those reconstructions, and then keep the values that exhibit the least error, according to Algorithm 1.

---

Algorithm 1 BC4w compression

Precondition: 8 × 8 depth blocks $D_i(x,y), i \in [1,N], x,y \in [1,8]$. State S per block, storing best endpoint pairs and associated block approximation errors. Coarse stride s.
Output: N BC4w blocks $B_i$
1: function CALCTILEERRORKERNEL(S,$d_0$,$d_1$)
2:   if kernel executed at fine level then
3:      $d_0 \leftarrow d_0 + s(S_{d_0} - 0.5)$   ▷ Reconstruct actual endpoints
4:      $d_1 \leftarrow d_1 + s(S_{d_1} - 0.5)$
5:   Reconstruct actual $d_0,d_1$ depending on execution as coarse or fine
6:   for each line l do   ▷ Executed in parallel from threads within a group
7:      Use $d_0,d_1$ as "left" endpoint pair and calculate error
8:      Update "left" endpoint pair and error state
9:      Use $d_0,d_1$ as "right" endpoint pair and calculate error
10:     Update "right" endpoint pair and error state
11: function PACKTOOUTPUTGPUKERNEL(S)
12:   Calculate line that reconstructs both state depth endpoint pairs with least total error
13:   Calculate per - pixel palette indices based on line and state depth endpoint pairs
14:   Build BC4w block based on line,depth and endpoint pairs and per - pixel palette indices
15: function MAIN
16:   Initialize state
17:   $d_{min} \leftarrow \max(\min D - 255, 0)$   ▷ Padded minimum depth value
18:   $d_{max} \leftarrow \min(\min D + 255, 65535)$   ▷ Padded maximum depth value
19:   for $d_0 \in [d_{min}, d_{max}]$ with step s do
20:      for $d_1 \in [d_{min}, d_{max}]$ with step s do
21:         Lauch kernel CalcTileErrorGpuKernel(S,$d_0$,$d_1$)
22:   for $d_0 \in [1,s]$ do
23:      for $d_1 \in [1,s]$ do

| Algorithm 1 BC4w compression |
| --- |
| 24:     Launch kernel CalcTileErrorGpuKernel(S,d₀,d₁) |
| 25: Launch kernel PackToOutputGpuKernel(S) |

In one configuration, the per-pixel palette indices may require 3 bits per pixel in the 8×8 pixel tile. In addition, the line specification for the 8×8 tile may require a total of 12 bits, 3 per line point coordinate. As the palette indices require 192 bits (3×8×8), each depth endpoint needs to be packed in 13 bits, in order for them to fit in the 32 byte memory block. This quantization introduces an insignificant error in the endpoint storage (1e-04) that experience has shown is acceptable for a lossy codec. The bit allocation according to one configuration is shown in Table 1.

TABLE 1

| | | 13 bits | | 3 bits |
| --- | --- | --- | --- | --- |
| 2 bytes | | endp0_left | | linep0x |
| 2 bytes | | endp1_left | | linep0y |
| 2 bytes | | endp0_right | | linep1x |
| 2 bytes | | endp1_right | | linep1y |
| 24 bytes | i0 | i1      i2 | ... | i63 |
| | 3 bits | | | |

Returning to FIG. 1, after generating per-frame quadtrees such as the quadtree 140, the compression application further transcodes the quadtree data to a more lightweight form: a flat list of non-overlapping nodes, shown as the packed form 150, that can be used to reconstruct the (partial, masked) image at a fixed maximum error threshold for the final compressed stream. The packed form 150 is an in-memory representation of the quadtree 140, with quadtree 140 elements (texture patches) of a given type being stored in the same contiguous memory, i.e., packed into texture memory together. Use of the packed form 150 may improve decoding performance that is paramount to high-throughput data such as light field videos.

A per-frame quadtree may be used to reconstruct an image at any error threshold $E_{max}$, up to its maximum reconstruction error and down to lossless. That is, $E_{max}$ is the maximum error (which may be, e.g., user-specified) that is tolerated for the reconstruction of a frame. The maximum error threshold in generating the packed form 150 is then $E \leq E_{max}$, as every quadtree 140 node can reconstruct itself with error e and the worst-case reconstruction error bound in generating the packed form 150 is $E_{max}$, so the decompression application needs to traverse all of the quadtree 140 nodes and generate the packed form 150 as a list of nodes that can reconstruct depth with error $e \leq E_{max}$ while pruning all other nodes above and below, with the maximum error among all the nodes of the packed form 150 being E.

In one configuration, the compression application may generate the packed form 150 by extracting flat nodes from the quadtree 140, which may include traversing the quadtree 140 top-to-bottom, depth-first, while stopping at nodes that can sufficiently approximate the underlying image region within error e and copying those nodes to the output stream. In such a case, the packed form 150 is not a tree anymore, as the packed form 150 may only include nodes that are marked as leaf nodes. That is, the compression application traverses the quadtree and stops at nodes that can be reconstructed below the error threshold e, and the compression application marks those nodes as leaves and prunes everything below and above in the quadtree 140. As a result, the packed form 150 is no longer a tree but is instead a flat list of such leaf nodes.

As described, the packed form 150 is a flat form of the partial, masked image, and the packed form 150 may include a fixed header and variable payload data. In such a case, the header stores the total number of flat nodes and the number of flat nodes per level, while the payload data stores the per-node offsets followed by the per-node coefficient values. The 2D offsets are stored using 2 bytes in one configuration, exploiting the fixed power-of-two node sizes and the knowledge about what level a node represents. As each node starts at $2^{2+i}(x, y)$, where i is the quadtree level, the offsets can be represented for a 1024×1024 image. To minimize storage costs, in one configuration the compression application may store just the coefficient values and two bits for identification of the modeling function used.

When stored video data is later loaded into a decompression application (e.g., the decompression application 723 shown in FIG. 7) during reconstruction 170, then rather than minimizing storage, the goal becomes to maximize decoding efficiency. In one configuration, the decompression application allocates, for each node, the same amount of memory (e.g., 32 bytes for coefficient values and 2 bytes for offset values) so that the node data can be efficiently random-accessed. Separating the payload into offset data and coefficient data also allows 128-bit aligned accesses that are preferred in some GPU architectures, improving decoding performance. The packed form may not (but also may) include information about the tile type, which can be implicitly determined from the node level and certain bit values in the 32-byte coefficient block as:

A 4×4 pixel block uses the raw modeling function.
The biquadratic modeling function requires 24 bytes, so the last 8 bytes are set as 0xFF.
The platelet modeling function requires 28 bytes, so the last 4 bytes are set as 0xFF.
The 4-byte BC4w data block that describes endpoints and lines is stored at the end, as no such valid block would be filled with 0xFF.

From the above, the decompression application may apply the following logic to determine the tile type:
If the 8 last coefficient bytes are 0xFF, the coefficients represent a biquadratic function
Otherwise, if the 4 last coefficient bytes are 0xFF, the coefficients represent a platelet
Otherwise, the coefficients represent a BC4w function As described, the input depth images 110 may be associated with six video streams per camera view probe, one per cubemap face. Each cubemap-face video stream may be further subdivided into smaller cells, so that individual cells can be selectively decompressed (also referred to herein as "decoded"), or not, based on if their content is visible to the viewer. That is, the compressed content may be decoded and reconstructed (e.g., in real-time) from an arbitrary viewpoint within a predefined viewing volume, and the decompression application performs view-dependent decoding in which only those cameras that provide useful data that is currently visible to a user are selected for a video frame to be displayed to the user, with the decompression application further selecting portions (e.g., grid cells) of the viewpoints (e.g., faces of a cubemap camera) that are visible to the user from the selected cameras.

The compressed video for each probe may further be stored as a contiguous data buffer of runtime packed forms, organized by frame, cubemap face, and cell, shown in FIG. 1 as the per-probe video 160. That is, the compressed images for a probe are assembled into a single stream that can be decoded at runtime, i.e., each video stream corresponds to depth data as seen by a light field probe in the scene. In one configuration, per-frame look-up tables may also be stored to identify the buffer offset for a given combination of (frame, face, cell), as well as the data buffer memory range utilization per frame. The buffer and tables may be stored in, e.g., GPU memory, and the decoding output is cubemap texture faces. For each of the probes described above, the decompression application may maintain a state: the frame that was last loaded in each cell of each frame. At every application frame, the decoding application determines the video frame that needs to be loaded and the cells of faces that are visible (even partially) to the viewer, as described above. The decoding application then compares such data on the visible cells (of the visible faces) with the stored state and identifies cells whose states are stale (i.e., invalid because they do not reflect the scene at the current point in time/space) and need to be updated. When both the buffer and lookup tables reside in GPU memory, the only CPU-to-GPU communication required is binding the buffer using the buffer range, binding the look-up table for the given frame and uploading the list of cell indices that need to be updated. A decoding compute shader may then be executed that dispatches a number of thread groups, where each thread group is comprised of a 4×4 grid of threads that maps to a region of a quadtree node. In such a case, the thread group (4×4 threads) is mapped to a 4×4 pixel region, and individual threads are mapped to pixels. For example, some quadtree nodes may be 4×4 pixels, some may be 8×8 pixels, some may be 16×16 pixels, etc., with 4×4 nodes being the smallest and the thread group of that size used as a greatest common divisor. In such a case, a 4×4 node will be decoded by a single thread group; a 8×8 node will be decoded by 4 thread groups, namely a 2×2 grid of thread groups; a 16×16 node will be decoded by a 4×4 grid of thread groups, etc. Although discussed herein primarily with respect to 4×4 working thread groups, other thread group sizes may be used in alternative configurations. In other words, the video stream is organized in a large buffer in one configuration, with additional per-frame buffers storing per-cell offsets (for a given combination of (frame, face, cell)), and at runtime the decompression application determines which cells need to be decoded based on visibility to the user and whether the cells have changed from a stored state, bounds the buffer range of interest and the appropriate offset buffer, and spawns decoding thread groups that each performs the appropriate decoding on a respective region of a quadtree node. During such decompression, the underlying goal is to do as similar work as possible within each thread group, such as reading from the same memory; doing the same operations to decompress data approximated using the raw, biquadratic, platelet, or BC4w modeling functions; etc. Doing so improves decoding performance, as the data stream is organized, accessed, and decoded in an efficient manner that can utilize the GPU as a massive data-parallel processor.

In one configuration, the decompression application decompresses data for each probe according to Algorithm 2. In Algorithm 2, indices (e.g., a cascaded index) are built to index the contiguous data buffer of runtime packed forms, and then the indices (e.g., thread IDs and thread group IDs) are used to determine which portion(s) of the buffer data to decompress, after which an appropriate decompression technique (for data approximated using the raw, biquadratic, platelet, or BC4w modeling functions) is determined based on the stored data according to, e.g., the logic for determining the tile type described above, and used to decompress the same. The majority of the decoding in Algorithm 2 relies on bit operations, which are relatively inexpensive to calculate.

---

Algorithm 2 Decompression of data for a single probe

---

Precondition: Coefficient data buffer B. Buffer offsets for current frame per face/cell $O_B$.
Output: Output depth cubemap $d_{out}$ (6 slices)
  1: nodePartIndex ← workgroupID ▷ Each part is an 4 × 4 block
  2: nodePartLocalCoords ← localThreadId ▷ values ∈ $[1,4]^2$
  3: faceCellindex, nodePartIndexInFaceCell ← CalculateFaceCell(nodePartIndex)
    ▷ faceCellIndex
    ∈ [1,24]
  4: bufferOffset ← $O_B$(faceCellIndex)
  5: (nodeCoeffs, nodeOffset, nodeLevel) ← ExtractBufferData(B, bufferOffset, nodePartIndexInFaceCell)
  6: nodeLocalCoords ← CalculateNodeLocalCoords(nodePartLocalCoords, nodePartIndexInFaceCell, nodeLevel)
  7: d ← 0
  8: if nodeLevel = 0 then
  9: d ← EvaluateRaw(nodeLocalCoords, nodeCoeffs)
10: else if IsBiquadratic(nodeCoeffs) then
11: d ← EvaulateBiquadratic(nodeLocalCoords, nodeCoeffs)
12: else if IsPlatelet(nodeCoeffs) then
13: d ← EvaulatePlatelet(nodeLocalCoords, nodeCoeffs)
14: else
15: d ← EvaulateBC4w(nodeLocalCoords, nodeCoeffs)

16: $d_{out}\left(nodeOffset + nodeLocalCoords, \dfrac{faceCellIndex}{4}\right) \leftarrow d$

---

Figure 5:
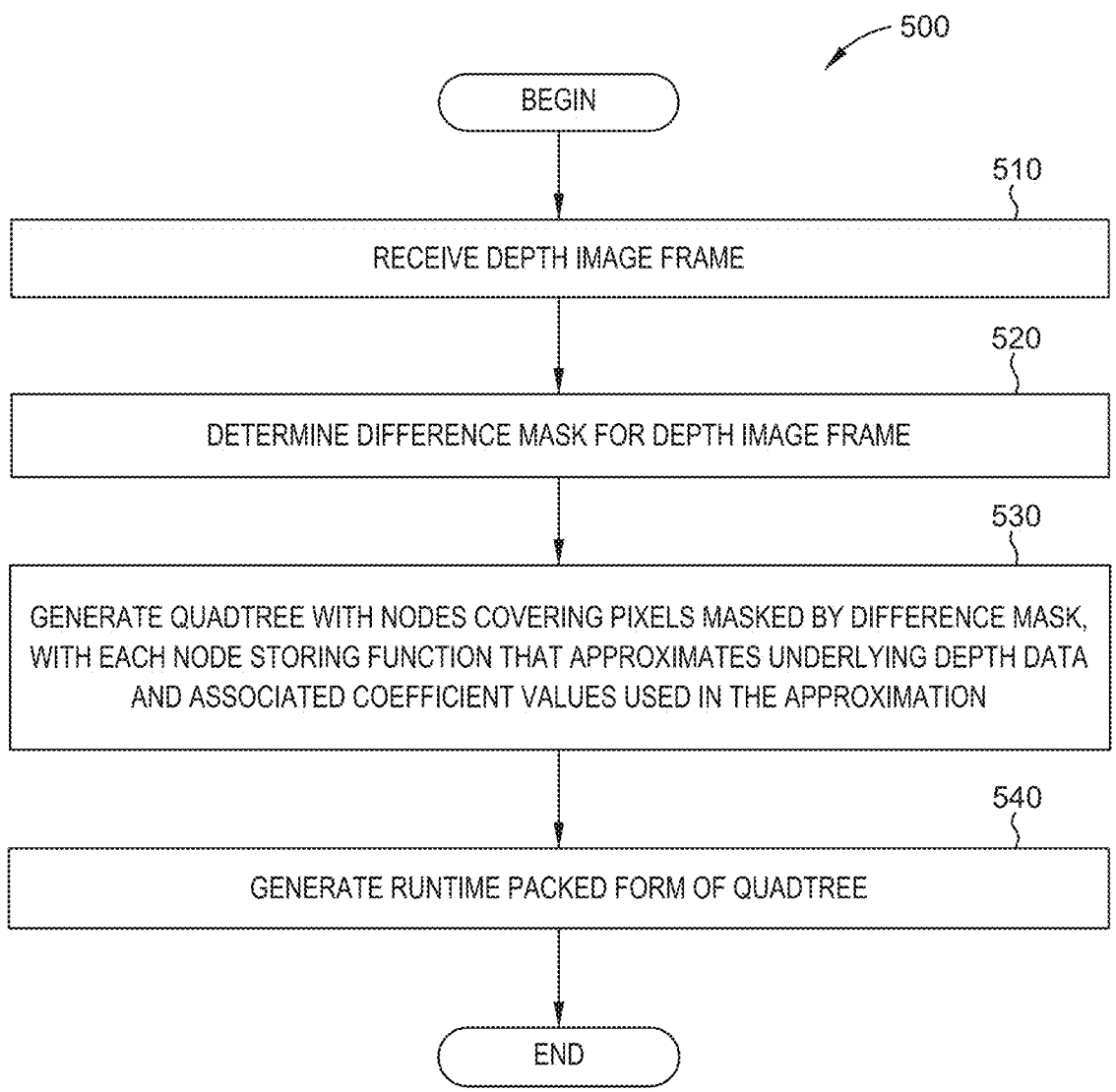
FIG. 5 illustrates a method for compressing a depth image frame, according to an aspect of this disclosure.

FIG. 5 illustrates a method 500 for compressing a depth image frame, according to an aspect of this disclosure. Although described for simplicity with respect to one depth image frame, the steps of the method 500 may be repeated to compress multiple depth images frames of, e.g., a video. As shown, the method 500 begins at step 510, where a compression application (e.g., the compression application 722 shown in FIG. 7) receives the depth image frame. The depth image frame may be an image that is rendered using, e.g., a face of one of a number of virtual cameras placed in a scene using any suitable camera placement technique. For example, 360° cubemap cameras may be placed in the scene, in which case the compression application may take as inputs depth images that are associated with six video streams per probe, one per cubemap face.

At step 520, the compression application determines a difference mask for the depth image frame. As described, the difference mask may indicate pixels that needed to be updated for the depth image, and in one configuration the compression application may determine the difference mask based on a comparison of differences between the depth image and the previous N depth image frames. That is, the compression application determines the difference mask for depth image i from depth frames [i–N, i]. In addition, the entirety of a depth image frame may be kept for keyframes, with a new keyframe being added when interpolation error that accumulated over time exceeds a given threshold.

At step 530, the compression application generates a quadtree with nodes covering the pixels masked by the difference mask determined at step 520, with each node storing a function that approximates the underlying depth data and associated coefficient values used in the approximation. In one configuration, the compression application calculates the quadtree bottom-to-top, with a node being approximated only if all of its children (in the mask) can be successfully approximated by a modeling function within the given error, as described above with respect to FIG. 2. In one configuration, the compression application may, after calculating the depth mask, determine the starting set of leaf 4×4 pixel nodes as follows: if a 4×4 pixel tile contains even a single masked pixel, the node is added to the quadtree. In order to identify if a coarser node needs to be calculated, the compression application may require that 3 out of 4 children of the coarse node exist. The majority of the underlying area is required to exist, because if only a single such child were required, then the updated area would be at least 75% redundant.

Any suitable modeling functions may be used to approximate the underlying data for each node of the quadtree. For example, each node may approximate the underlying data using one of the following four approximating functions that is determined to have an acceptable error $e_{max} \leq E_{max}$ and to minimize the MSE error of equation (2), as described above: raw, platelet, biquadratic, and BC4w. Experience has shown that of these four approximating functions, BC4w is the slowest, as the compression application needs to find an optimal 4D point in $[0, 65535]^4$ for each potential line that can intersect the tile. In one configuration, the compression application may employ an optimization that reduces the search space by only considering coordinates near the maximum and minimum depth values of the input data. In addition, the compression application may exploit the massively parallel nature of this optimization problem by spawning a GPU thread group for every 8×8 (or other sized) tile, with every thread in the thread group being assigned to an individual line. In such a case, the kernel may be executed for all 4D value combinations that are of interest and write to a state the running optimal point. Due to the performance-intensive nature of the compression and the occasional near-perfect approximations using platelets and biquadratics, the compression application in one configuration may approximate 8×8 tiles using other modeling functions, and if the peak signal to noise ratio (PSRN) is above 85, then the compression application does not approximate the tile, as experience has shown that most BC4w approximations result in PSRN of 85 or less.

At step 540, the compression application generates a runtime packed form of the quadtree. The packed form is a more lightweight form of the quadtree that includes a flat list of non-overlapping nodes that can be used to reconstruct the partial, masked depth image at a fixed maximum error threshold. In one configuration, the compression application may generate the runtime packed form by traversing the quadtree top-to-bottom and depth-first, copying nodes that can sufficiently approximate the underlying image region within an error to the output stream, as described above. To minimize storage cost, one configuration may store the coefficients from each quadtree node and two bits for identifying the modeling function used.

Where 360° cubemap cameras are used as probes in the manner described above, in one configuration the compression application may store the compressed video for each probe as a contiguous data buffer of runtime packed forms, organized by frame, cubemap face, and cell.

Figure 6:
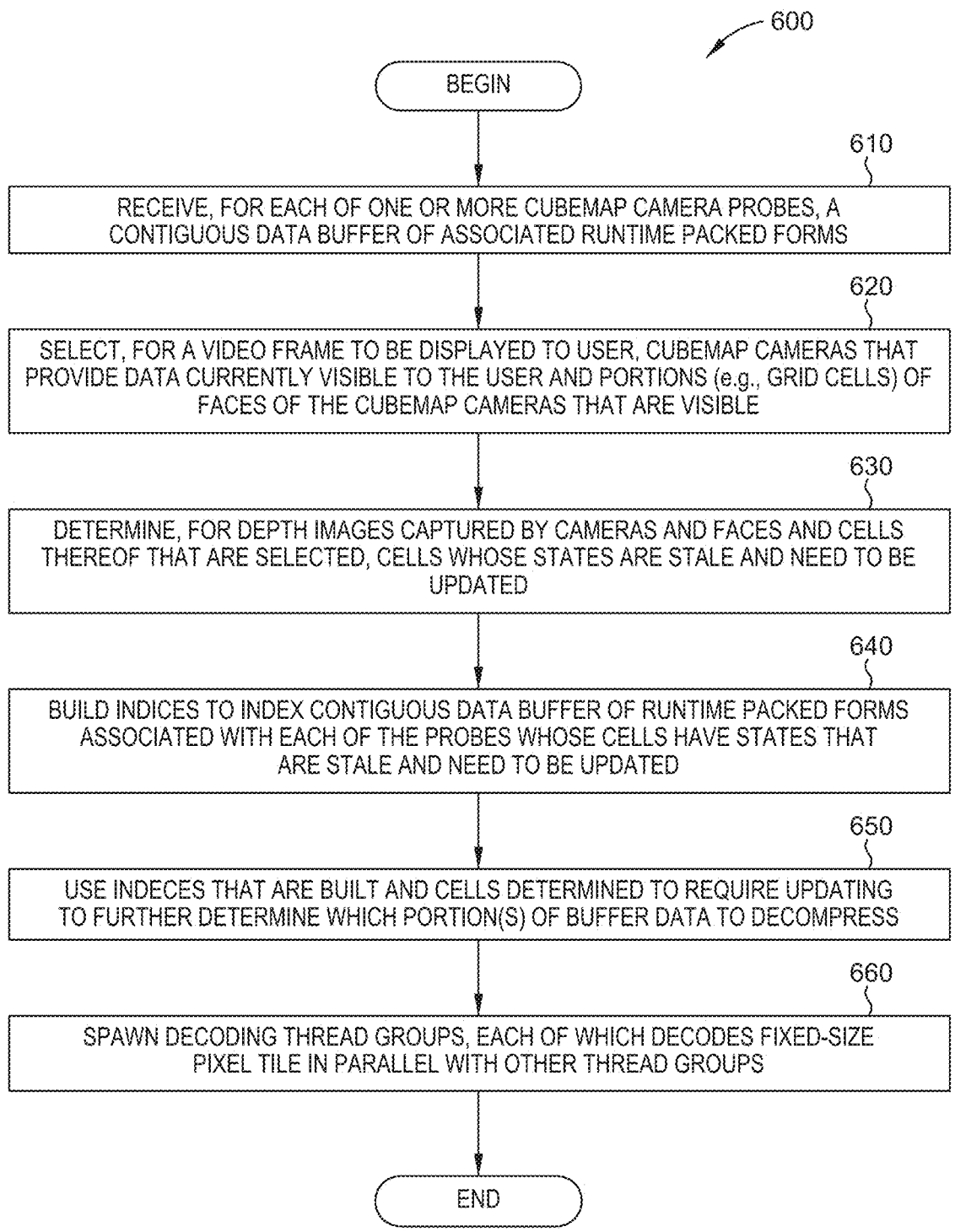
FIG. 6 illustrates a method for decompressing a compressed depth image frame, according to an aspect of this disclosure.

FIG. 6 illustrates a method 600 for decompressing a compressed depth image frame, according to an aspect of this disclosure. The method 600 assumes that the image frames for a number of faces of each cubemap camera probe have been compressed and stored as the contiguous data buffer of runtime packed forms described above. It should be understood, however, that in general the data being decompressed may be associated with any light field probes rather than cubemap cameras in particular. As shown, the method 600 begins at step 610, where a decompression application (e.g., the decompression application 723 shown in FIG. 7) receives, for each of one or more cubemap camera probes, a contiguous data buffer of associated runtime packed forms.

At step 620, the decompression application selects, for a video frame to be displayed to the user, cubemap cameras that provide data currently visible to the user and portions (e.g., grid cells) of faces of the cubemap cameras that are visible. As described, there are six video streams for each cubemap camera probe, one per cubemap face, and each cubemap-face video stream may further be subdivided into smaller cells that can be selected for decoding, or not, depending on if their content is visible to the viewer, such as using the selection techniques disclosed in U.S. patent application Ser. No. 15/971,950, entitled "REAL-TIME RENDERING WITH COMPRESSED ANIMATED LIGHT FIELDS.

At step 630, the decompression application determines, for depth images captured by the cameras and faces and cells thereof that are selected at step 620, cells whose states are stale (i.e., invalid) and need to be updated based on camera movement and elapsed time. As described, in one configuration the decompression application may maintain a state including the frame that was last loaded in each cell of each frame. In such a case, the decompression application may compare the data on the visible cells of the visible faces with the stored state and identify cells whose states are stale, which are then the cells that need to be updated.

At step 640, the decompression application builds indices to index the contiguous data buffer of runtime packed forms associated with each of the probes whose cells are stale and need to be updated. Any technically feasible index or indices, such as a cascaded index, may be used.

At step 650, the decompression application uses the indices that are built at step 630 and the cells determined at step 620 to require updating to further determine which portion(s) of the buffer data to decompress. As described, each video stream may be organized in a large buffer in one configuration, with additional per-frame buffers storing per-cell offsets (for a given combination of (frame, face, cell)), and in such a case, the decompression application may bound the buffer range of interest along with the appropriate offset buffer, which together correspond to the cells that need to be updated as determined at step 620.

At step 660, the decompression application spawns decoding thread groups, each of which decodes a fixed-size pixel tile in parallel with other thread groups. As described, in one configuration each thread group includes threads that map to a region of a quadtree node, the thread group determines an appropriate decompression technique (for data approximated using the raw, biquadratic, platelet, or BC4w modeling functions) based on stored data in the associated region and according to logic for determining the tile type described above, and then the threads of that thread group use the determined decompression technique to decompress the stored data. That is, each thread group determines an appropriate decompression technique for the region (e.g., a 4×4 region), and all threads of a thread group use the same decompression technique. It should be understood that after the depth data is decompressed, it may be used along with corresponding color data (that may be separately decompressed) to render the video frame that is displayed to the user via, e.g., a head-mounted display or other display device such as a screen or even projected in a dome.

Figure 7:
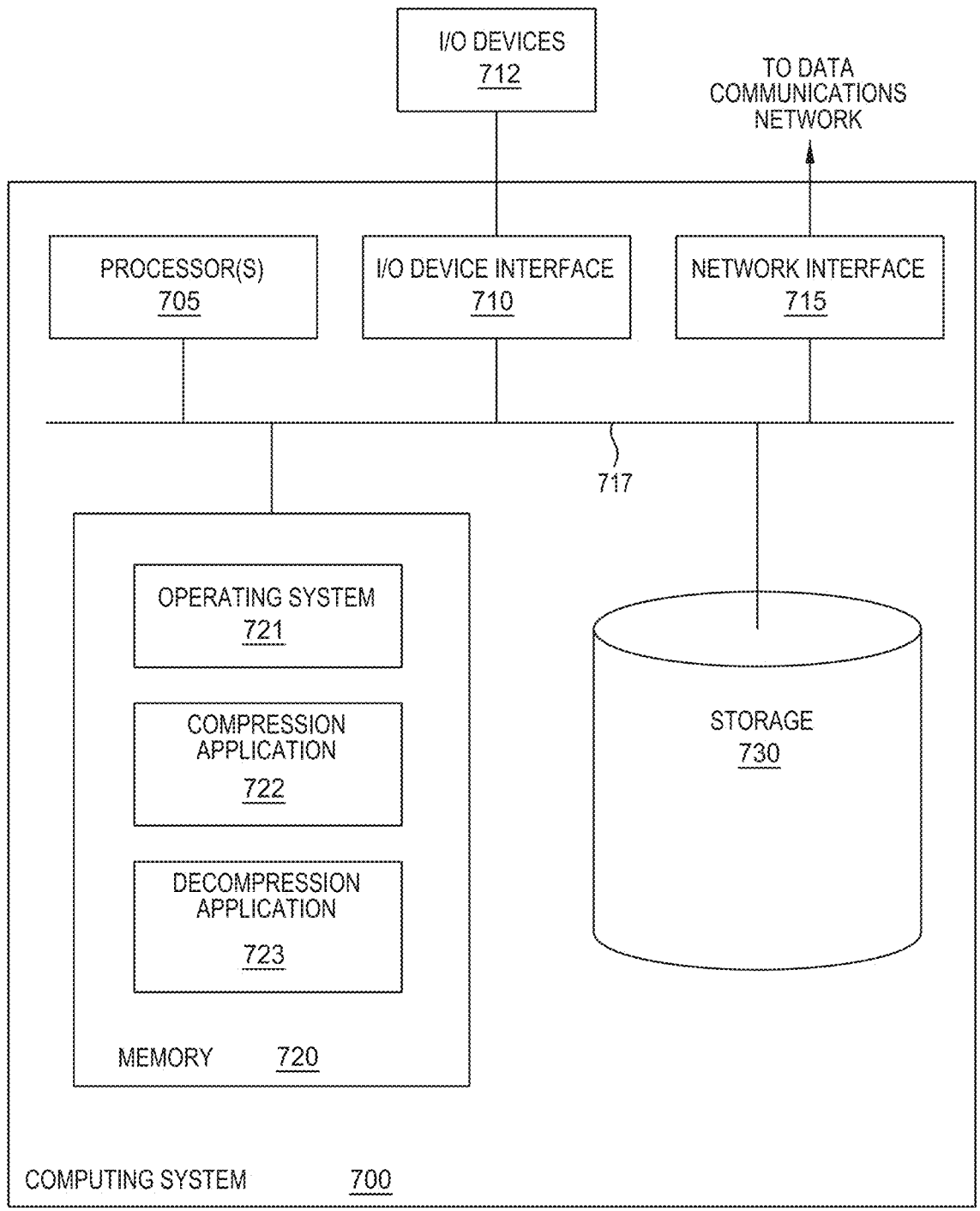
FIG. 7 illustrates a system in which an aspect of this disclosure may be implemented.

FIG. 7 illustrates a system 700 in which an aspect of this disclosure may be implemented. As shown, the system 700 includes, without limitation, a processor(s) 705, a network interface 715 connecting the system to a network 716, an interconnect 717, a memory 720, and storage 730. The system 700 may also include an I/O device interface 710 connecting I/O devices 712 (e.g., keyboard, display and mouse devices) to the system 700.

The processor(s) 705 retrieve and execute programming instructions stored in the memory 720. Similarly, the processor(s) 705 store and retrieve application data residing in the memory 720. The interconnect 717 facilitates transmission, such as of programming instructions and application data, between the processor(s) 705, I/O device interface 710, storage 730, network interface 715, and memory 720. Processor(s) 705 is included to be representative of a single central processing unit (CPU), multiple CPUs, a single CPU having multiple processing cores, one or more GPUs, and the like. And the memory 720 is generally included to be representative of a random access memory. The storage 730 may be a disk drive storage device. Although shown as a single unit, the storage 730 may be a combination of fixed and/or removable storage devices, such as magnetic disk drives, flash drives, removable memory cards or optical storage, network attached storage (NAS), or a storage area-network (SAN). Further, system 700 is included to be representative of a physical computing system as well as virtual machine instances hosted on a set of underlying physical computing systems. Further still, although shown as a single computing system, one of ordinary skill in the art will recognized that the components of the system 700 shown in FIG. 7 may be distributed across multiple computing systems connected by a data communications network.

As shown, the memory 720 includes an operating system 721, a compression application 722, and a decompression application 723. The compression application 722 is configured to spatially (and temporally) compress depth images, including those having high bit-depth. It should be understood, however, that the compression application 722 may also perform other functionalities, either by itself or in conjunction with other applications, such as determining camera placements in a scene and offline rendering using the placed cameras. In one configuration, the compression application 722 may receive depth image frames and, for each of the received depth image frames: determine a difference mask for the depth image frame; generate a quadtree with nodes covering pixels masked by the determined difference mask, with each node storing a function that approximates the underlying depth data and associated coefficient values used in the approximation; and generate a runtime packed form of the quadtree, according to the method 500 described above with respect to FIG. 5. The decompression application 723 is configured to decompress per-probe videos. It should be understood, however, that the decompression application 723 may also perform other functionalities, either by itself or in conjunction with other applications, such as rendering video frames that are displayed to a user using the decompressed per-probe videos. In one configuration, the decompression application 723 may receive, for each of one or more cubemap camera probes, a contiguous data buffer of associated runtime packed forms; select, for a video frame to be displayed to the user, cubemap cameras that provide data currently visible to the user and portions (e.g., grid cells) of faces of the cubemap cameras that are visible; determine, for the cameras and faces and cells thereof that are selected, cells that have changed and need to be updated; build indices to index the contiguous data buffer of runtime packed forms associated with each of the probes whose cells have changed and need to be updated; use the indices that are built and the cells determined to require updating to further determine portion(s) of the buffer data to decompress; and spawn decoding thread groups, each of which decodes a fixed-size pixel tile in parallel with other thread groups, according to the method 600 described above with respect to FIG. 6.

Advantageously, a depth image and video codec is disclosed herein that can be used to spatially compress and decompress depth images of high bit-depth, such as the depth images associated with a rendered video. The disclosed codec is aimed for high-quality reconstruction, as aggressive depth compression allowing high errors can create problems when geometric reconstruction of a scene is desired. At the same time, the codec permits relatively fast hardware-accelerated decoding that also allows partial extraction for view-dependent decoding. In particular, the codec permits GPU-accelerated decompression of several high-resolution video streams simultaneously, allowing three-dimensional (3D) reconstruction and real-time exploration of captured or offline-rendered videos with the capability of compositing additional 3D elements and characters due to the existence of an accurately reconstructed depth video stream. Experience has shown that the performance of the compression in the disclosed codec is better compared to simple texture updates, even though the decompression complexity is higher, and the improved decompression performance can be explained by the batching of block compression tasks to relatively few shader calls and the spawning of a thread per block, thereby exploiting the massively data parallel nature of GPUs. Also disclosed is a BC4w block compression format that may be used in the depth video codec in some configurations, but also as a generic block compression technique for depth data that exhibits discontinuities as well as surface variation. The codec disclosed herein may be used in any applications that require high-performance depth streaming, such as 3D movies, video games, virtual reality (VR), augmented reality application of light fields, live virtual production use cases, or other 3D environments in an immersive manner.

The flowchart and block diagrams in the Figures illustrate the architecture, functionality, and operation of possible implementations of systems, methods and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A computer-implemented method, comprising:
    determining a mask for a received depth image frame based, at least in part, on differences between the received depth image frame and one or more previous depth image frames; and
    generating a quadtree data structure that includes nodes associated with pixels of the depth image frame masked by the determined mask, wherein each node of the generated quadtree data structure indicates a respective function, of a plurality of functions, used to approximate a corresponding portion of the received depth image frame and coefficient values used in the approximation, wherein at least one function of the plurality of functions is selected based on a maximum-absolute-distance determination in log-space and a mean-squared-error determination.

2. The computer-implemented method of claim 1, further comprising, generating a runtime packed form of the quadtree data structure by:
    traversing the quadtree data structure top-to-bottom and depth-first; and
    copying, to the generated runtime packed form, nodes of the quadtree data structure that are configured to approximate corresponding portions of the received depth image frame within an error.

3. The computer-implemented method of claim 2, further comprising, assembling the generated runtime packed form and other runtime packed forms associated with a light field probe into a video stream.

4. The computer-implemented method of claim 3, further comprising, decompressing at least a portion of the assembled video stream by performing steps including:
    selecting, for a video frame to be displayed to a user, one or more visible portions of faces of the light field probe;
    determining one or more of the visible portions that need to be updated;
    building indices to index the assembled video stream;
    determining one or more portions of the video stream to decompress based, at least in part, on the indices and the one or more of the visible portions that need to be updated; and
    spawning one or more thread groups for the determined one or more portions of the video stream, wherein each of the one or more thread groups decompresses a respective pixel tile in the determined one or more portions of the video stream.

5. The computer-implemented method of claim 4, wherein each thread in each thread group of the one or more thread groups reads from a same memory and performs the same decompression operations as other threads in the thread group.

6. The computer-implemented method of claim 1, wherein:
    the quadtree data structure is generated from bottom to top; and
    when the quadtree data structure is being generated, a node of the quadtree data structure is approximated only if its child nodes in the determined mask can be approximated by a same function of the plurality of functions within an error.

7. The computer-implemented method of claim 1, wherein the at least one function is selected by performing steps including:
    determining, for each function of the plurality of functions, a respective maximum absolute distance in log-space between a respective portion of the received depth image frame and an approximation of the respective portion of the received depth image frame using the function;
    retaining one or more of the plurality of functions associated with determined maximum absolute distances that are less than a threshold value;
    determining, for each function of the retained functions, a respective mean-squared error between the respective portion of the received depth image frame and the approximation of the respective portion of the received depth image frame using the function; and
    selecting the at least one function based, at least in part, on the determined mean-squared errors for the retained functions.

8. The computer-implemented method of claim 1, wherein the plurality of functions includes at least one of a raw, a platelet, a biquadratic, or a BC4-Wedged (BC4w) function.

9. The computer-implemented method of claim 8, wherein:
    the BC4w function approximates depth data for a given pixel tile using a line and two pairs of endpoints; and
    for each pixel of the given pixel tile in the BC4w function approximation:
        one of the pairs of endpoints is selected based on a halfspace in which the pixel lies with respect to the line, and
        a depth value in the depth data for the pixel is snapped to a nearest palette index associated with the selected pair of endpoints.

10. The computer-implemented method of claim 9, wherein the BC4w function is evaluated by sampling a parameter space to determine optimal values for the line, two depth ranges represented by the pairs of endpoints, and a respective palette index associated with one of the pairs of endpoints for each pixel of the given pixel tile.

11. A non-transitory computer-readable storage medium storing a program, which, when executed by a processor performs operations comprising:
    determining a mask for a received depth image frame based, at least in part, on differences between the received depth image frame and one or more previous depth image frames; and
    generating a quadtree data structure that includes nodes associated with pixels of the depth image frame masked by the determined mask, wherein each node of the generated quadtree data structure indicates a respective function, of a plurality of functions, used to approximate a corresponding portion of the received depth image frame and coefficient values used in the approximation, wherein at least one function of the plurality of functions is selected based on a maximum-absolute-distance determination in log-space and a mean-squared-error determination.

12. The computer-readable storage medium of claim 11, the operations further comprising, generating a runtime packed form of the quadtree data structure by:
    traversing the quadtree data structure top-to-bottom and depth-first; and
    copying, to the runtime packed form, nodes of the quadtree data structure that are configured to approximate corresponding portions of the received depth image frame within an error.

13. The computer-readable storage medium of claim 12, the operations further comprising, assembling the generated runtime packed form and other runtime packed forms associated with a light field probe into a video stream.

14. The computer-readable storage medium of claim 13, the operations further comprising, decompressing at least a portion of the assembled video stream by performing steps including:
    selecting, for a video frame to be displayed to a user, one or more visible portions of faces of the light field probe;
    determining one or more of the visible portions that need to be updated;
    building indices to index the assembled video stream;
    determining one or more portions of the video stream to decompress based, at least in part, on the indices and the one or more of the visible portions that need to be updated; and
    spawning one or more thread groups for the determined one or more portions of the video stream, wherein each of the one or more thread groups decompresses a respective pixel tile in the determined one or more portions of the video stream.

15. The computer-readable storage medium of claim 11, wherein:
    the quadtree data structure is generated from bottom to top; and
    when the quadtree data structure is being generated, a node of the quadtree data structure is approximated only if its child nodes in the determined mask can be approximated by a same function of the plurality of functions within an error.

16. The computer-readable storage medium of claim 11, wherein the at least one function is selected by performing steps including:
    determining, for each function of the plurality of functions, a respective maximum absolute distance in log-space between a respective portion of the received depth image frame and an approximation of the respective portion of the received depth image frame using the function;
    retaining one or more of the plurality of functions associated with determined maximum absolute distances that are less than a threshold value;
    determining, for each function of the retained functions, a respective mean-squared error between the respective portion of the received depth image frame and the approximation of the respective portion of the received depth image frame using the function; and
    selecting the at least one function based, at least in part, on the determined mean-squared errors for the retained functions.

17. The computer-readable storage medium of claim 11, wherein the plurality of functions includes at least one of a raw, a platelet, a biquadratic, or a BC4-Wedged (BC4w) function.

18. The computer-readable storage medium of claim 17, wherein:
    the BC4w function approximates depth data for a given pixel tile using a line and two pairs of endpoints; and
    for each pixel of the given pixel tile in the BC4w function approximation:
        one of the pairs of endpoints is selected based on a halfspace in which the pixel lies with respect to the line, and
        a depth value in the depth data for the pixel is snapped to a nearest palette index associated with the selected pair of endpoints.

19. The computer-readable storage medium of claim 18, wherein the BC4w function is evaluated by sampling a parameter space to determine optimal values for the line, two depth ranges represented by the pairs of endpoints, and a respective palette index associated with one of the pairs of endpoints for each pixel of the given pixel tile.

20. A computer-implemented method, comprising:
    determining a mask for a depth image frame based, at least in part, on differences between the depth image frame and one or more previous depth image frames; and
    generating a quadtree data structure that includes nodes associated with pixels of the depth image frame masked by the mask, wherein each node of the quadtree data structure indicates a respective function of a plurality of functions and coefficient values associated with the respective function, wherein at least one function of the plurality of functions approximates depth data for a pixel tile in the depth image frame using a line and two pairs of endpoints on respective sides of the line, wherein the at least one function is evaluated by:
        sampling a parameter space of coefficient values for the line, the two pairs of endpoints, and a respective palette index for each pixel of the pixel tile;
        determining, based on the sampling, coefficient values for the line, the two pairs of endpoints, and the respective palette index for each pixel that minimize an error, wherein the respective palette index that is determined for each pixel is associated with one of the two pairs of endpoints that are determined; and
        storing the coefficient values for the line, the two pairs of endpoints, and the respective palette index for each pixel.

* * * * *

UNITED STATES PATENT AND TRADEMARK OFFICE
CERTIFICATE OF CORRECTION

PATENT NO. : 11,153,550 B2
APPLICATION NO. : 16/138460
DATED : October 19, 2021
INVENTOR(S) : Kenneth J. Mitchell et al.

It is certified that error appears in the above-identified patent and that said Letters Patent is hereby corrected as shown below:

On the Title Page

Item (57), in Column 2, in "Abstract", Line 17, delete "3DC+(BC4)" and insert -- 3DC+ (BC4) --.

In the Drawings

On sheet 7 of 8, in Figure 6, reference numeral 650, Line 1, delete "INDECES" and insert
-- INDICES --.

In the Specification

In Column 2, Line 57, delete "3DC+(also" and insert -- 3DC+ (also --.

In Column 8, Line 7, delete "z =" and insert -- $z_{xy}$ = --.

In Column 8, Line 64, delete "334;" and insert -- $334_i$ --.

In Column 9, Line 28, delete "3Dc+(also" and insert -- 3Dc+ (also --.

In Columns 9-10, Line 61, delete "line,depth" and insert -- line, depth --.

In Columns 9-10, Line 69, delete "Lauch" and insert -- Launch --.

In Columns 13-14, Line 55, delete "EvaulateBiquadratic(nodeLocalCoords," and insert
-- EvaluateBiquadratic(nodeLocalCoords, --.

In Columns 13-14, Line 57, delete "EvaulatePlatelet(nodeLocalCoords," and insert
-- EvaluatePlatelet(nodeLocalCoords, --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,153,550 B2

In Columns 13-14, Line 59, delete "EvaulateBC4w(nodeLocalCoords," and insert -- EvaluateBC4w(nodeLocalCoords, --.

In Column 16, Line 3, delete "(PSRN)" and insert -- (PSNR) --.

In Column 16, Line 6, delete "PSRN" and insert -- PSNR --.